United States Patent [19]

Lockwood et al.

[11] 4,380,804
[45] Apr. 19, 1983

[54] EAROM CELL MATRIX AND LOGIC ARRAYS WITH COMMON MEMORY GATE

[75] Inventors: George C. Lockwood, Dayton; Murray L. Trudel, Centerville, both of Ohio

[73] Assignee: NCR Corporation, Dayton, Ohio

[21] Appl. No.: 220,644

[22] Filed: Dec. 29, 1980

[51] Int. Cl.³ .................... G11C 11/40; G11C 7/00
[52] U.S. Cl. ............................ 365/184; 365/191; 357/23
[58] Field of Search ............... 365/184, 185, 191; 357/23 VT

[56] References Cited

U.S. PATENT DOCUMENTS

| | | | |
|---|---|---|---|
| 4,099,196 | 7/1978 | Simko | 365/185 |
| 4,112,507 | 9/1978 | White et al. | 365/184 |
| 4,175,291 | 11/1979 | Spence | 365/184 |
| 4,314,265 | 2/1982 | Simko | 365/185 |

FOREIGN PATENT DOCUMENTS 55-138278 10/1980 Japan ...................... 365/184

OTHER PUBLICATIONS

Tarui et al, IEEE jour. of Solid-State Cir., vol. SC-7, No. 5, 10/72, pp. 369-375, "Electrically Reprogrammable Nonvolatile Semiconductor Memory".
Bentchkowsky, "FAMOS-A New Semiconductor Charge Storage Device", Solid-State Electronics, Pergamon Press, vol. 17, pp. 517-529, 1974.
Grice et al, "Electrically Programmable Logic Array", IBM Tech. Disc. Bul., vol. 22, No. 10, 3/80, pp. 4621-4622.
Giebel, "An 8k EE PROM Using the SIMOS Storage Cell", IEEE Jour. of Solid-State Cir., vol. SC-15, No. 3, 6/80, pp. 311-315.
H. A. Richard Wegener, "The Gated-Access MNOS Memory Transistor," IEEE Trans. on Electron Devices, vol. ED-27, No. 1, pp. 266-276, Jan. '80, (published approx. Feb. 14, 1980).
Y. N. Hsieh et al, "Electrically Alterable Programmable Logic Array (EAPLA)," 1980 International Electron Devices Meeting, (IEDM) Tech. Digest, pp. 598-601, Dec. 8-10, 1980.
R. Kondo et al, "Dynamic Injection MNOS Memory Devices," Digest of Technical Papers, The 11th Conf. on Solid State Devices, Tokyo, pp. 165 and 166, Aug. 1979.
R. Kondo et al, "Dynamic Injection MNOS Memory Devices," Proc. of 11th Conf. (1979 International) on Solid State Devices, Tokyo, Japanese Jour. of Applied Physics, vol. 19, Supp. 19-1, pp. 231-237, 1980.
K. Horninger, "A High-Speed ESFI SOS Programmable Logic Array with an MNOS Version," IEEE Jour. of Solid-State Circuits, vol. SC-10, No. 5, pp. 331-336, Oct. 1975.

*Primary Examiner*—Stuart N. Hecker
*Attorney, Agent, or Firm*—J. T. Cavender; Philip A. Dalton; Casimer K. Salys

[57] ABSTRACT

A three gate programmable memory cell comprised of a variable threshold memory element medial of two access gate elements, together forming a series path whose conductive state can be altered by any one of the series elements. Each cell has lines for individually accessing the three gate electrodes, in addition to line connections to opposite ends of the conductive path formed by the elements in series. In one form, an alterable threshold transistor is connected in series between two field effect transistors, one of the two controlling cell addressing and the other actuating the read mode. The cell is erased with a high voltage pulse on the memory line. Subsequent programming of the cell is defined by the voltage states on the word and bit lines of the addressing transistor in time coincidence with an opposite polarity, shorter duration pulse on the memory line. The logic state stored in the cell is defined by the presence or absence of a conductive path through the cell when all three gates are biased to their read mode levels. A unitary configuration of the cell includes a single substrate, with a channel defined between doped node regions. Electrically isolated gate electrodes of the three transistors are symmetrically disposed adjacent each other over the channel to control its conductivity in segments. The cells are amenable to being grouped in arrays, while retaining the independence of the high voltage memory line and the flexibility of individual row and column addresses.

8 Claims, 10 Drawing Figures

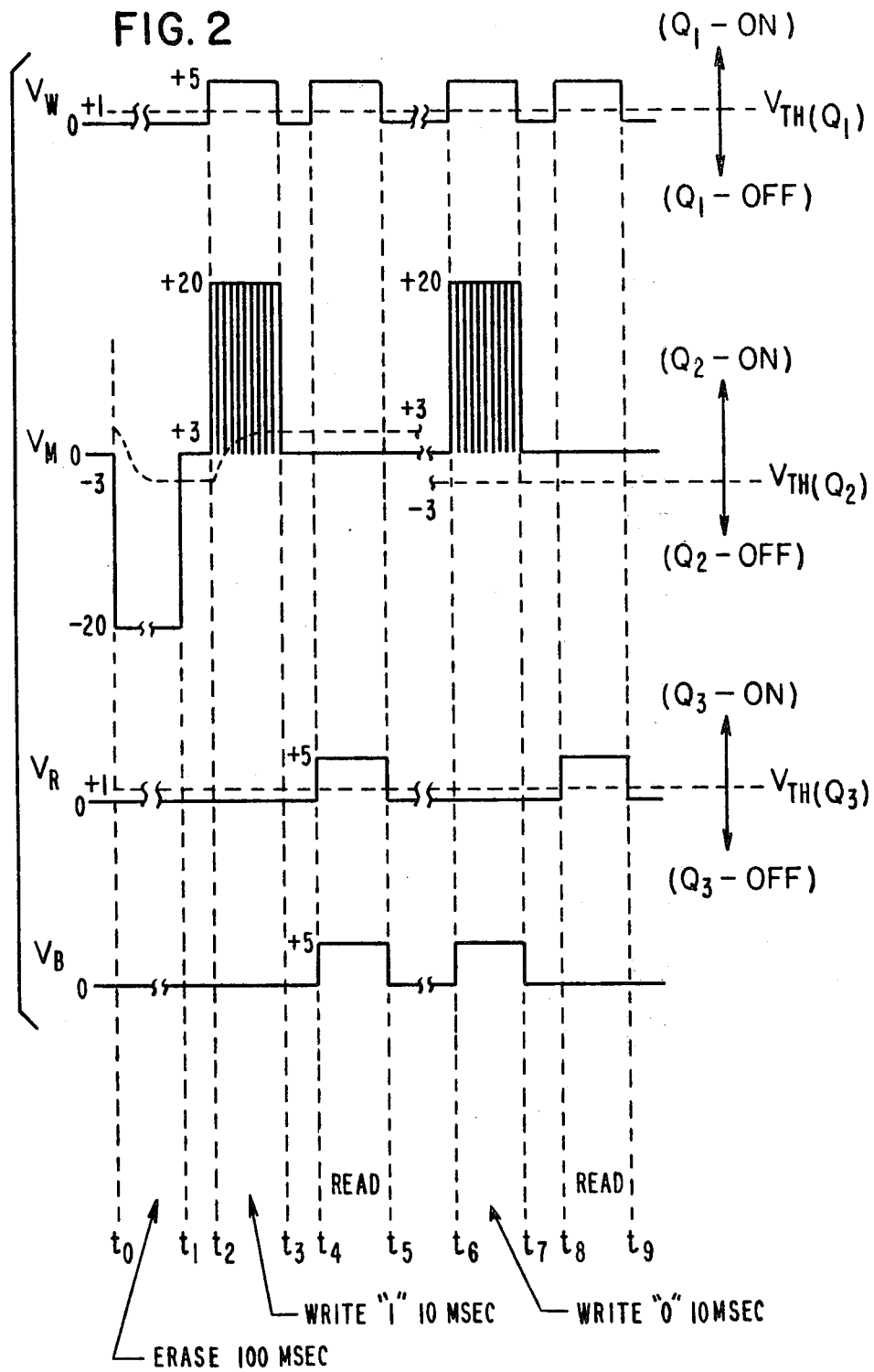

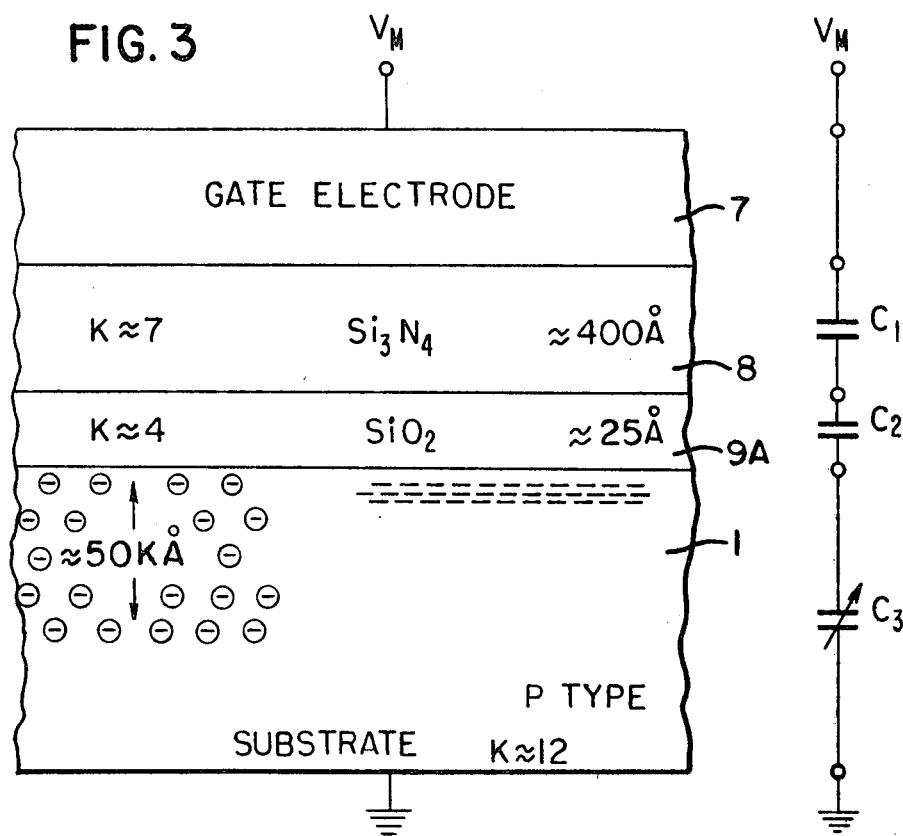
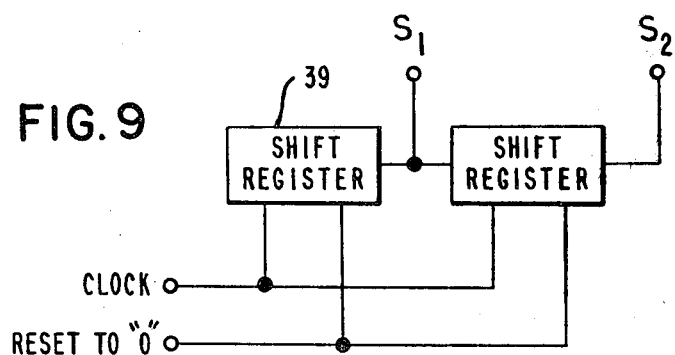

EAROM CELL MATRIX AND LOGIC ARRAYS WITH COMMON MEMORY GATE

BRIEF SUMMARY

The present invention is directed to a unique electrically programmable memory cell, its configurations in matrix arrays, and its organization in programmable logic arrays (PLAs). The essential features of the individual cells, as well as groups thereof, are inherently linked to their internal structure of three series connected gates, and an independent memory line for conveying high voltage programming signals into the memory elements within the cells. The use of a distinct and dedicated line to program the memory element overcomes the multitude of functional and structural limitations normally constraining semiconductor chip designs when memory programming voltages are to be routed through address, data or control lines.

In particular, the cell communicates through the combination of bit and word address lines, a read line and a memory line. The latter is used to erase and write (program) each cell, and is therefore normally subjected to voltages far exceeding those appearing on the other lines. In one form, the invention contemplates three cell gates formed by the series connection of a field effect transistor (FET), an alterable threshold transistor and another FET, defining a channel of variable conductivity between a bit address line at one end and a grounded line at the other. A conductive path therebetween defines one cell state, while a nonconductive path provides the other. For purposes of reading the cell's state, the word line, connected to one FET gate electrode, and the read line, connected to another FET gate electrode, are energized as the memory line, connected to the alterable threshold transistor gate electrode, is biased to its read condition. Sensing the presence or absence of a conductive path between the bit line and the grounded line during the read mode indicates the cell's state. With the series connected word and read FETs energized to conduct, the relationship between the memory bias level and the alterable transistor threshold prescribes the conductivity of that gate and the complete cell. If, as taught herein, the memory element threshold level is altered above or below the memory line bias level during programming, the overall state written in the cell is also changed.

An erase pulse on the memory line prepares the cell for the succeeding write sequence. The cell is then programmed by opening the path through the read FET and appropriately energizing the memory element with a voltage on the memory line. If the memory line voltage pulse is sufficiently long in overall duration, yet comprised of multiple relatively short pulses, the memory element will be written to a new state when the combination of bit line and word line voltages causes the word FET to conduct.

The programmable memory cell described above is readily amenable to a unitary structural organization, in which a single substrate has a conductively doped bit line region, a conductively doped region at ground potential and a channel therebetween covered by two conventional field effect gate electrodes on either side of an alterable threshold transistor electrode. This configuration of the cell is particularly suited for processes in which the electrodes are formed by layered depositions of heavily doped, and therefore conductive, polycrystalline silicon.

The diversity of lines by which each cell is coupled permits fabrication in matrix arrays while retaining the independence of the high voltage memory line. In such arrays all memory lines can be commonly joined. Depending on the array configuration one or two read lines suffices. Connection of bit lines and word lines into row and column addresses is readily accomplished in numerous ways, substantially dictated by the design objectives of the overall array.

A further refinement of the cells into groups is generally known as the programmable logic array (PLA). Again, the memory line remains distinct from the other lines in the array. Data to be processed enters the PLA through the logic AND segment of the array and departs from the logic OR segment. Consistent with the basic operating principles of the cell, data is processed in concurrence with a read signal on the read line and an appropriate bias level on the memory line. For programming, the logic AND and OR segments of the array are decoupled. The cell states are entered into the AND segment through the array input lines, while the OR segment is written through a coupling with array output lines. During programming, rows or columns of the array segments are scanned sequentially with synchronization of the word line, bit line and memory line pulses.

DESCRIPTION OF THE DRAWINGS

FIG. 2 contains plots of voltage vs. time during the operation of the cell in FIG. 1.

FIG. 3 schematically depicts various conditions within the gate region of an MNOS transistor type memory element.

FIG. 4 is a schematic of the capacitance distribution associated with the regions in FIG. 3.

FIG. 9 is a schematic of a shift register circuit suitable for defining a programming sequence for the PLA.

DETAILED DESCRIPTION

Read only memories (ROMs) are generally well known by those practicing in the computer arts. The electrically-alterable version of the ROM, generally designated by the acronym EAROM (or EEPROM), is a subclass having the general nonvolatile attribute of the ROM while simultaneously exhibiting the ability to have stored data electrically altered. This invention relates to such devices, with special recognition of the trend toward single chip arrays of large overall area and small cell size, processed directly on silicon wafer substrates.

The present invention addresses itself to a problem of particular concern to designers of EAROMs generally, and particularly those designers of such memory arrays who utilize alterable threshold transistors to form the nonvolatile memory elements within the cells. Taking the case of MNOS type alterable threshold transistors as an example, writing and erasing requires the use of relatively high voltages, heretofore routed directly on address or control lines of the chip. For instance, writing or erasing typically demands plus or minus twenty volts at the gate electrode of the MNOS transistor, compared to the five volt levels normally utilized for control and logic functions. Naturally, the pursuit of increased memory storage per chip area, by reducing the transistor and interconnect dimensions, is in direct conflict with the circuit spacings necessary to prevent breakdowns between conductive layers on the chip. The problems attributable to high voltage signals are particularly acute for n-channel devices, where electrons are driven deep into insulating materials by the high voltages and significantly alter the electrical properties of these materials.

The invention overcomes these conflicting objectives while retaining the intrinsic attributes of EAROM. As embodied, it teaches a three gate memory cell comprised of series connected field effect type transistors. Addressing is by bit and word lines, erasing and writing is performed by way of a commonly connected memory line, and reading is performed by the concurrence of a low voltage memory line bias and a read line command signal. In this way, the address and control circuits experience only the low voltage, logic level signals.

At the onset, it should be noted that the references herein to alterable threshold transistors include the broad class of devices in which the MNOS transistor is merely one constituent. Proceeding even further, the term MNOS as utilized herein is generic, encompassing the group of alterable threshold transistors in which threshold levels are changed by the conduction of charge from the transistor channel through a thin oxide layer into a region between the channel and gate. Variants within the generic group include devices having nonmetallic (heavily doped polycrystalline silicon) gate electrodes and diverse combinations of oxide thicknesses, distributions and compositions.

Figure 1:
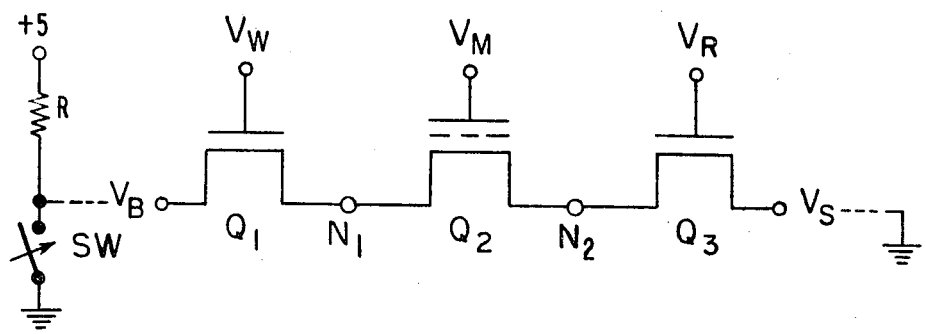
FIG. 1 is a schematic depicting the functional organization of the cell.

Furthermore, though the cell is initially described with reference to a functional representation, FIG. 1, showing discrete transistors joined by terminal electrodes, it should be understood that the basic concepts are preferably implemented in an integrated configuration containing multiple gate electrodes located over a single conductive channel. Nevertheless, to aid in describing the cell operation, virtual nodes $N_1$ and $N_2$ are shown connecting memory transistor $Q_2$ with access transistors $Q_1$ and $Q_3$ on opposite sides thereof.

To develop the invention in an orderly format, it will be presented first as a fundamental cell, then described in terms of its operation, its structural configuration, its organization in memory and logic arrays, and its fabrication. Where possible, identical reference numerals, device labels and node voltage symbols will be retained throughout. Accordingly, when the individual cell is being described, the term "electrode" will be associated with the transistor gates, while the points in the conductive path will be designated as "nodes." However, once the cells are organized into groups the more conventional term "line" will be used to designate points of electrical connection. It should be clearly recognized that the embodiments described are merely exemplary of the numerous and varied ways in which the invention may be practiced.

Commence the analysis by looking at the functional circuit of the three gate cell depicted schematically in FIG. 1, and its associated time-plots of voltage appearing in FIG. 2. The embodiment of the basic cell comprises a series connection of three transistors, $Q_1$–$Q_3$. At the left extreme of the cell is node $V_B$ (the subscript representing bit line). The right side of the cell terminates at node $V_S$. Virtual nodes $N_1$ and $N_2$ join the three transistors. As their names imply, virtual nodes $N_1$ and $N_2$ do not normally exist as points of electrical contact. For purposes of the ensuing description, transistors $Q_1$ and $Q_3$ are enhancement mode, n-channel devices, and conduct when the voltages at their respective gate electrodes, $V_W$ (the subscript representing word line) and $V_R$ (the subscript representing read line), exceed their $+1$ volt fixed, gate-to-source threshold voltage. Transistor $Q_2$ embodies an MNOS device having an electrically alterable threshold voltage with extremes of approximately $-3$ and $+3$ volts. Actuation of the MNOS transistor, as well as its programming, is performed through the gate electrode designated $V_M$ (the subscript representing memory line). Clearly, to form a conductive path between nodes $V_B$ and $V_S$, all three transistors must be on. For purposes of the embodiment, the logic voltages at $V_W$ and $V_R$ are either $+5$ volts or 0 volts, while electrode $V_M$ is subject to a bias level of 0 volts, a relatively long pulse at $-20$ volts or a sequence of short pulses at $+20$ volts, during the course of reading, erasing and writing the memory cell, respectively. The voltages and their transitions will be considered with greater particularity in the ensuing paragraph covering the cell operation.

To the left and right of the cell in FIG. 1 are functional circuits representing the operational devices by which the cell state can be programmed and read. Node $V_S$ is normally coupled to the voltage system ground while bit node $V_B$ is coupled to a point at either ground potential or $+5$ volts, depending on the position of switch SW. Resistor R is high enough in ohmic value that a conductive path between nodes $V_B$ and $V_S$ brings node $V_B$ to substantially ground potential.

By definition, a conductive path between bit node $V_B$ and node $V_S$ is a logic "0" state of the cell, while a nonconductive path therebetween prescribes the logic "1" state. In FIG. 2 of the drawings, the conductive states of the individual transistors are shown at the right of each plot. The threshold voltages, designated $V_{TH}$, for each of the cell transistors are also depicted in the figure.

Given the foregoing, commence the operational analysis by observing the waveforms at time $t_0$. As shown, the cell is to be subjected to a voltage of $-20$ volts at memory electrode $V_M$. This period, labeled the ERASE mode, is approximately 100 milliseconds in duration. The effect of the high voltage pulse on electrode $V_M$ of MNOS transistor $Q_2$ is to shift the threshold from any prior level to $-3$ volts. The shift in threshold level, shown by dashed lines, places the cell in a logic "0" state at the termination of the ERASE mode. During the ERASE mode interval, $T_0$ to $t_1$, the voltages on nodes $V_B$ and $V_S$, as well as electrodes $V_W$ and $V_R$, are not constrained.

The next time interval of interest, between time $t_2$ and $t_3$, is shown to be approximately 10 milliseconds in duration. Functionally, the cell is in a WRITE mode with a logic state of "1" being programmed. To program the logic "1" state into the cell, MNOS transistor $Q_2$ receives a high duty cycle sequence of ten $+20$ volt, one millisecond pulses on gate electrode $V_M$ in time coincidence with a +5 volt signal on word electrode $V_W$ of transistor $Q_1$ and 0 volts on bit node $V_B$. This combination of voltages places transistor $Q_1$ in a conducting state, and effectively couples a level of 0 volts through transistor $Q_1$ to transistor $Q_2$. During this same WRITE interval, read electrode $V_R$ remains at 0 volts, inhibiting any conduction through transistor $Q_3$. Thereby, node $V_S$, at ground potential, is effectively decoupled from $Q_2$ in the cell. The significance of the pulse sequence voltage, duration and duty cycle will be introduced at a later point, for the present it suffices to note that the presence of +20 volt pulses on gate electrode $V_M$ of the MNOS transistor in time coincidence with a 0 voltage level conveyed through transistor $Q_1$ alters the threshold voltage of $Q_2$ from −3 volts to its opposite extreme of +3 volts. The cell is now programmed to a logic state of "1".

Given the foregoing sequence of events, the ensuing READ mode interval, between time $t_4$ and $t_5$, should elicit a logic "1" state from the cell. As shown in FIG. 2, reading the cell is performed with a +5 volt command signal on read electrode $V_R$ of transistor $Q_3$. The cell is addressed by the combination of a +5 volt signal on word electrode $V_W$ and a high impedance, +5 volt address voltage on bit node $V_B$. During the READ mode, memory electrode $V_M$ of transistor $Q_2$ is subjected to the selected bias level of 0 volts. As may be gleaned from the time plots, under these conditions only $Q_1$ and $Q_3$ are conducting, the voltage on electrode $V_M$ of memory transistor $Q_2$ being below the threshold necessary to cause conduction therethrough. Without a conductive path through the complete cell, the address signal on bit node $V_B$ is not grounded to node $V_S$. Consequently, the absence of a conductive path, represented by +5 volts at node $V_B$, corresponds to a logic "1" state in the cell.

For purposes of contrast, consider another WRITE mode interval, $t_6$ to $t_7$, presumed to occur at some point directly succeeding the event designated by time $t_1$. Further presume the objective is to write a logic "0" state into the cell. Again, a sequence of ten +20 volt pulses is applied to MNOS transistor electrode $V_M$, +5 volts to word electrode $V_W$ of transistor $Q_1$ and 0 volts to read electrode $V_R$ of transistor $Q_3$. However, in contrast to the previous WRITE mode sequence, bit node $V_B$ is energized with a +5 volt signal of comparable duration. In the context of transistor connections and voltages, node $V_B$ during that interval corresponds to the source terminal of transistor $Q_1$. Thus, with both the gate and source electrodes of $Q_1$ at +5 volts, transistor $Q_1$ remains nonconducting. The effective floating of MNOS transistor $Q_2$, by the absence of conductive paths through either transistors $Q_1$ or $Q_3$, inhibits the alteration of the threshold voltage in transistor $Q_2$. The mechanism by which this occurs, and the constraints on pulse duration, will be considered in detail at a point hereinafter.

The succeeding READ mode sequence, spanning the time interval $t_8$ to $t_9$, yields a logic "0" state from the cell. Namely, the 0 volt bias level on electrode $V_M$ during the READ mode is above the −3 volt threshold programmed within MNOS transistor $Q_2$. With MNOS transistor $Q_2$, transistor $Q_1$ and transistor $Q_3$ all conducting during the READ mode, the +5 volt, high impedance voltage on bit node $V_B$ is grounded through node $V_S$. The presence of zero volts at node $V_B$ during the READ mode corresponds to a logic "0" state in the cell.

Selection of 0 volts as the bias level for electrode $V_M$ during the READ mode is preferred from the standpoint of implementation ease and minimizing noise susceptibility. Likewise, though the threshold voltage levels of +3 and −3 are mere examples, symmetry about 0 volts is preferred over asymmetric threshold levels in MNOS transistor $Q_2$. Irrespective of the actual amplitudes selected, the concepts underlying the invention remain.

In partial summary, then, a logic "1" state is programmed into the memory cell when the cell undergoes an ERASE mode followed by a WRITE mode in which $V_W$, $V_M$ and $V_B$ are respectively, +5 volts, +20 volts and 0 volts. The embodiment also shows that a logic "0" state remains programmed after erasing when $V_W$ receives +5 volts, $V_M$ receives +20 volts, but $V_B$ is provided with +5 volts. Proceeding further, one undoubtedly recognizes that two other combinations of word and bit states are possible. The following truth table provides a compilation of the various combinations and their effects on the state written into the cell.

TABLE A

| $V_W$ STATE (Word Line)* | $V_B$ STATE (Bit Line)* | PROGRAMMED THRESHOLD OF $Q_2$ | WRITTEN STATE OF $Q_2$** |
|---|---|---|---|
| 0 | 0 | −3 | 0 |
| 0 | 1 | −3 | 0 |
| 1 | 0 | +3 | 1 |
| 1 | 1 | −3 | 0 |

*0 represents 0 volts; 1 represents +5 volts
**0 represents conducting; 1 represents nonconducting Though two of the combinations shown have not been described in detail, it is believed that one of nominal skill in the art can readily develop the remaining two combinations by following the above-described procedures.

Figure 5:
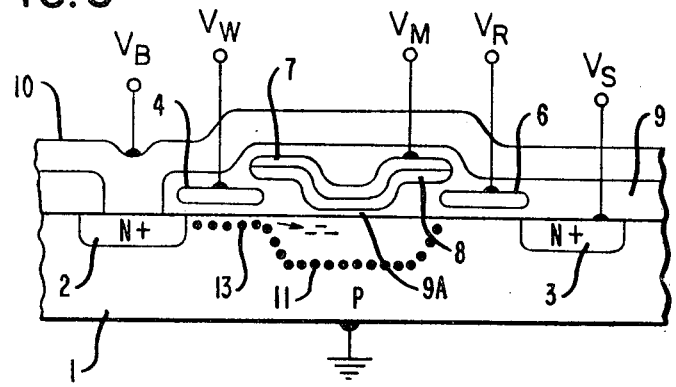
FIG. 5 contains a schematic cross-section of a unitary cell with operational illustrations.

The phenomena by which cell writing is inhibited for various combinations of word, bit and memory voltages are best described with reference to FIGS. 3, 4 and 5. FIG. 3 schematically shows the gate electrode region of MNOS transistor $Q_2$, while FIG. 4 depicts the corresponding distribution of capacitance among the various layers shown in FIG. 3. FIG. 5 expands the region of analysis to include the effects of transistors $Q_1$ and $Q_3$.

Assume the MNOS transistor in FIG. 3 has been erased previously and is now being subjected to a sequence of high duty cycle (typically in excess of 90%) +20 volt WRITE mode pulses at gate electrode $V_M$ in accordance with the scheme depicted in FIG. 2. At a point in time immediately after the onset of each one millisecond pulse the channel region of the lightly doped p-type silicon substrate is driven into deep depletion, i.e. the substrate is depleted of holes by the repulsive effect of the electric field between gate electrode $V_M$ and the grounded substrate. These initial conditions in the substrate are represented on the left side of FIG. 3, which shows a depleted layer extending from the substrate surface to a depth in the range of approximately 50,000 Angstroms.

Given the relative similarity of dielectric constants in the layer materials, ranging from approximately 4 to approximately 12, the distributed capacitance among the layers in the MNOS transistor can be represented by the schematic shown in FIG. 4, with the magnitudes of capacitance being in substantially inverse proportion to the layer thicknesses. Consequently, the magnitudes of capacitors $C_1$ and $C_2$ are significantly greater than $C_3$ immediately after the onst of each 1 millisecond pulse. With the three capacitors arranged in electrical series, the +20 volt write pulse on electrode $V_M$ is distributed among the capacitors so that the substantial majority appears across the smallest capacitor, $C_3$. With only a few volts across the silicon nitride and silicon dioxide layers, the threshold of the MNOS transistor is not altered, i.e. $Q_2$ remains at its erased threshold of $-3$ volts.

The deep depletion state, as well as the related voltage distributions, are transitory conditions. Immediately after the depletion region is formed, thermally generated electron-hole pairs within the region begin to reduce its depth. The negative constituents of the pairs are drawn into close proximity with the junction between the substrate and the silicon dioxide. In a short period of time, the depletion region shrinks in thickness and increases in capacitance. As a result of the changes in the depletion region depth, the distribution of the voltage between electrode $V_M$ and the substrate is altered so that a greater portion of the voltage appears across capacitors $C_1$ and $C_2$, the capacitors representing the silicon nitride and silicon dioxide layers. Given sufficient time, the voltage across the silicon nitride and silicon dioxide layers increases until the magnitude is adequate to permanently alter the MNOS transistor threshold. The latter condition is represented by the illustration on the right side of the substrate in FIG. 3.

Note that the embodiment depicted in FIG. 2 prescribes a WRITE mode signal on the memory line consisting of ten pulses, each having a duration of approximately 1 millisecond. The time intervals are prescribed with a recognition that thermally generated electron-hole pairs will eventually collapse the deep depletion region, and thereby redistribute the voltage between electrode $V_M$ and the substrate ground sufficiently to write the MNOS transistor to a logic "1" state. The 10 millisecond overall WRITE mode duration provides sufficient time to insure that the MNOS transistor is completely and reliably programmed to its logic "1" state when appropriately commanded. On the other hand, the 1 millisecond duration of the constituent pulses is dictated by the requirement that programming to a logic "1" state not occur without the effects of external control. Namely, the period of each pulse, 1 millisecond, should be sufficiently brief to prevent significant alteration in the capacitance distribution. The brief zero level of the memory line signal between successive 1 millisecond pulses need only be adequate to collapse the depletion region between repetitive pulses, a period typically extending no greater than 5 or 10 nanoseconds.

One embodiment of the three transistor cell by which the invention may be practiced appears on FIG. 5 of the drawings. The n-channel cell is configured using a p-type substrate, 1, with n+ doped regions 2 and 3 therein. The field effect transistors (FETs) in the cell, $Q_1$ and $Q_3$, are characterized by gate electrodes 4 and 6, corresponding to previously noted electrodes $V_W$ and $V_R$, respectively. The MNOS transistor, $Q_2$, forms the middle region of the unitary cell. The MNOS transistor is shown to include gate electrode 7, corresponding to electrode $V_M$, silicon nitride layer 8 and a thin silicon dioxide layer, 9A. A thick silicon dioxide region, generally designated by the reference 9, encloses the three electrodes of the cell. Substrate 1 is shown connected to a ground potential. Diffusion region 2 is connected to node $V_B$ through metallic contact layer 10 while n+ doped region 3 is electrically common with node $V_S$. Regions and electrodes 3, 4, 6 and 7 are readily accessible for further interconnection by following fabrication techniques well-known to those practicing in the art.

Undoubtedly one now recognizes that virtual nodes $N_1$ and $N_2$, shown as distinct electrical connections between adjacent transistors in FIG. 1, are now mere continuums of the conductive channel in the substrate. The schematic in FIG. 1 and the structure in FIG. 5 therefore remain functionally identical.

The various concepts and structures introduced above will now be merged to show how and why the embodying three gate memory cell, as further exemplified by the unitary structure, is capable of being altered into prescribed nonvolatile states in accordance with the TABLE A. Namely, only when electrode $V_W$ is at logic "1" (+5 volts) and node $V_B$ is at logic "0" (0 volts) is the memory cell written to a "1" state. Also recall that during the WRITE mode electrode $V_R$ is provided with 0 volts and electrode $V_M$ with a sequence of +20 volt pulses in the manner previously described.

To avoid confusion at a later point, presume the cell to have undergone an ERASE mode sequence prior to commencing the WRITE mode. Thereby, a $-3$ volt threshold is initially programmed into the cell. Since the substrate is p-type, and the ERASE pulse is $-20$ volts, the ERASE phenomenon is rather rudimentary.

Begin the analysis of the various WRITE mode combinations in Table A with $V_W$ and $V_B$ at logic state "0" (0 volts) when the +20 volt WRITE mode pulses are applied to $V_M$. Reflecting back upon the narrative accompanying the illustrations in FIGS. 3, 4 and 5, one notes that substantially all the +20 volts during each interval appears across deep depletion region 11. Consequently, silicon nitride layer 8 and silicon dioxide layer 9A are not subjected to a voltage adequate to alter the threshold of the MNOS transistor. The voltage distribution shifting effects of thermally generated electron-hole pairs are avoided by the limited pulse duration of 1 millisecond. Since transistors $Q_1$ and $Q_3$ are nonconducting, no other sources of charge are available to rapidly thin the depletion region and thereby redistribute the write pulse voltage.

The next combination of binary states is similar in result. Though $V_B$ is now at a logic "1" (+5 volt) state, the 0 voltage on gate electrode $V_W$ inhibits conduction of transistor $Q_1$. Again, the threshold of transistor $Q_2$ remains unchanged from its post-erase state of "0".

Momentarily skipping the binary combination of "1" and "0" for $V_W$ and $V_B$ in Table A, consider the "1" and "1" combination of states. Again, as was the case during the previous WRITE modes, $Q_3$ is held in a nonconducting state by providing 0 volts to electrode $V_R$. Transistor $Q_1$ is now subjected to +5 volts at both gate electrode $V_W$ and the doped region connected to node $V_B$. However, since voltage differential between electrode $V_W$ and node $V_B$ is below the +1 volt threshold of transistor $Q_1$, the transistor does not conduct. Again, the voltage divider effect between the MNOS transistor layers, coupled with the short duration of the individual pulses on node $V_M$, prevents the writing of MNOS memory transistor $Q_2$.

In contrast, now consider the combination where $V_W$ is at logic state "1" (+5 volts) and $V_B$ is at logic state "0" (0 volts) when the sequence of +20 volt WRITE mode pulses appears at electrode $V_M$. As with all the previous combinations of Table A, a depletion region, 11, is initially formed in the substrate adjacent memory transistor $Q_2$ after the onset of each pulse. In this case, however, transistor $Q_1$ is biased on, forming a conductive channel, 13, between region 2, at 0 volts, and depletion region 11. Since conductive channel 13 readily supplies all the electrons necessary to rapidly collapse the depletion region, it becomes apparent that a significant portion of each +20 volt WRITE pulse now is impressed across the silicon nitride and silicon dioxide layers, 8 and 9A, of MNOS transistor $Q_2$. Consequently, the MNOS memory transistor is written to a +3 volt threshold and the logic state stored in the cell is switched from a logic "0" to a logic "1" state.

In partial summary, the three gate cell is shown to be capable of individual programming by using low voltage word and bit address signals in synchronism with high voltage memory electrode pulses. Furthermore, as described at the onset, the high voltage pulses themselves do not appear on the conductive paths coupling the cell logic states, but rather, are relegated to a dedicated and distinct electrical conductor.

Though the foregoing embodiment of the three gate cell was described with reference to an n-channel configuration, those skilled in the art readily recognize that the underlying concepts are amenable to implementation with p-channel logic devices.

Attention is now directed to various utilizations of the three gate cell to implement unique memory and logic functions. Hereinafter, the terms electrodes and nodes will be replaced with the term lines. The latter term is more consistent with the prior art and configurations containing a multiplicity of cells. Furthermore, organization of and reference to lines and cells within arrays shall follow a format in which word lines, connected to gate electrodes in the cells, form the rows of the array, while the bit lines form the columns.

Figure 6:
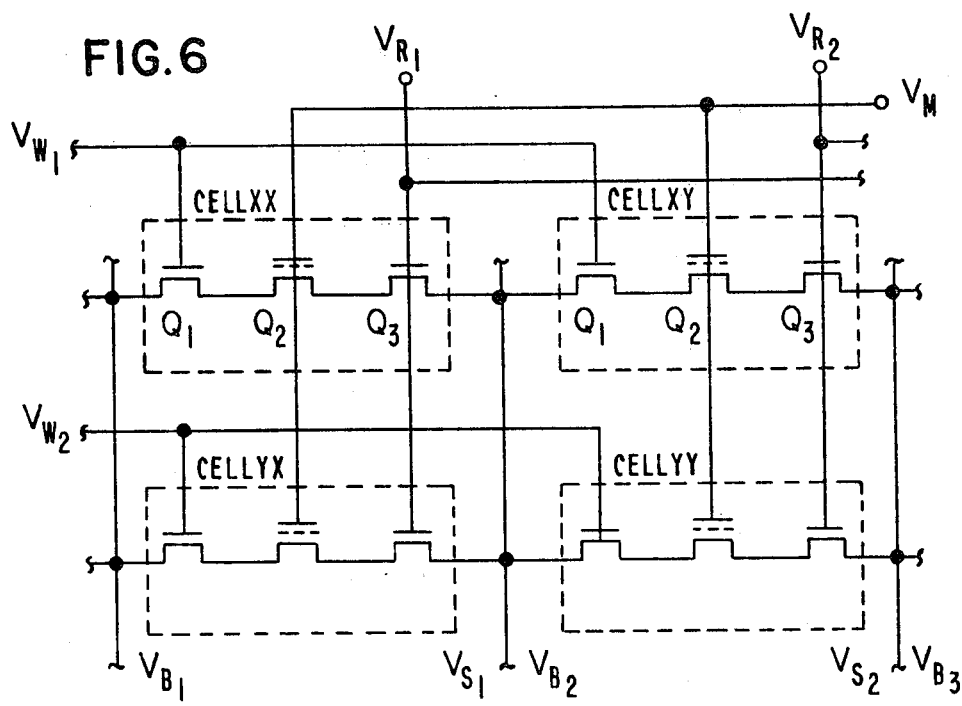
FIG. 6 schematically shows one organization of cells in a matrix array.

As a first example, consider the matrix memory array shown in FIG. 6. The three gate, three transistor cells, individually designated as XX, XY, YX and YY, are in a configuration having a common connection of memory lines $V_M$, a common connection of read lines $V_R$ by alternate columns and a common connection of word lines $V_W$ in respective rows. Bit lines $V_B$ and lines $V_S$ are common between successive cells in respective rows and further common in respective columns.

The organization of cells and lines as shown in FIG. 6 is particularly conducive to MOS integrated circuit fabrication processes in which the word lines consist of metallic interconnects joining doped polycrystalline silicon gate electrodes, the read and memory lines are formed from heavily doped polycrystalline silicon, and the bit lines are heavily doped regions formed in the substrate itself.

One undoubtedly recognizes that this basic configuration is readily amenable to an expansion having M rows by N columns of memory cells in an array. In such a case, the M row address lines each commonly connect the word lines of the cells in corresponding rows, while N+1 column lines do likewise for the cells by column. The number of read lines remains at two.

Consider the operation of the array shown in FIG. 6. Initially, recall that lines other than $V_M$ are not constrained during the ERASE mode pulse. For events thereafter, refer to the plots in FIG. 2. Analysis of the waveforms during the succeeding WRITE mode shows that this organization of cells permits sequential programming of rows or columns. Namely, since both lines $V_{R1}$ and $V_{R2}$ are at 0 volts, the and associated cell transistors, $Q_3$, are made nonconducting, logic voltages introduced on common bit lines, such as $V_{S1}/V_{B2}$ or $V_{S2}/V_{B3}$, affect only one column. For instance, if cell $YY^2$ is to be written to the "1" state 0 volts is applied to bit line $V_{S1}/V_{B2}$ as word line $V_{W2}$ receives +5 volts. The presence or absence of +5 volts on adjacent bit line $V_{S2}/V_{B3}$ is inconsequential.

Figure 7:
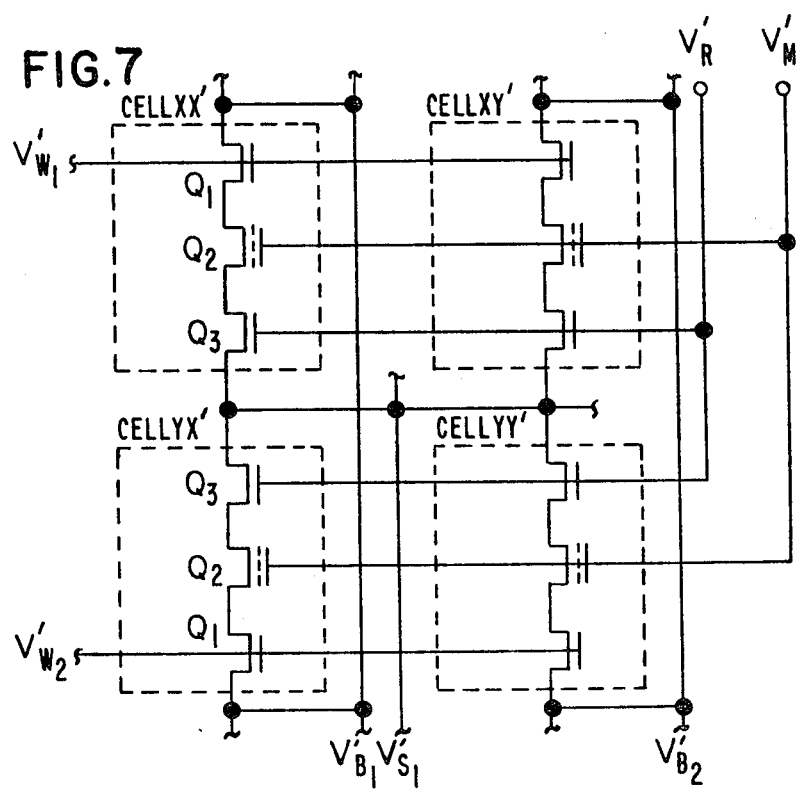
FIG. 7 schematically shows a second organization of cells in a matrix array.

Another organization of the three gate cells into a memory array is schematically depicted in FIG. 7 of the drawings. Note that the cells are generally organized in symmetric pairs on common structural columns. Each pair shares a common line $V_S$ and common bit line $V_B$, with line $V_S$ further being shared commonly by successive structural columns. This array is also characterized by word lines, designated $V_{W1}'$ and $V_{W2}'$, which are not shared by the cell pairs noted above, but rather, are common in respective rows of the array structure. Note again, that programming of each cell during the WRITE mode remains individually controlled by the binary states on word lines, $V_{W1}'$ and $V_{W2}'$, and bit lines, $V_{B1}'$ and $V_{B2}'$.

The organization of the memory array as depicted in FIG. 7 is also conducive to an integrated circuit layout. Preferably, the lines $V_S'$ are formed by doped conductive regions in the substrate, bit lines $V_B'$ are composed of metallic conductors, while the read, word and memory lines are formed from conductively doped polycrystalline silicon.

As was true of the array in FIG. 6, the group of cells in FIG. 7 can also be expanded to an M row by N column array. By analyzing the array shown, one recognizes that M row address lines are necessary to access the M rows of structural cell in the array. Further investigation reveals that N column address lines are also required.

Operation of the array in FIG. 7 during the ERASE mode follows in conventional manner. During the WRITE mode, however, the cell organization depicted in FIG. 7 permits the programming of either individual cells or adjacent pairs simultaneously. For instance, if cells XY' and YY' are to be written "0" and "1", respectively, line $V_{B2}'$ is brought to 0 volts, line $V_{W1}'$ to 0 volts, and line $V_{W2}'$ to +5 volts as the sequence of +20 volt WRITE mode pulses is applied to line $V_M'$. If $V_{B1}'$ is held at +5 volts, cells XX' and YX' are not affected.

An alternate method of programming the arrays in FIGS. 6 and 7 prescribes that the array word and bit address lines be rapidly scanned with appropriate signal levels during each pulse interval when the WRITE line is energized with +20 volts. This method of programming reduces the number of pulses on the memory line, and therefore the compiled stress on individual MNOS transistors attributable to the programming sequence. Recalling that the techniques described above programmed the arrays by columns (or rows), with a WRITE mode pulse sequence being provided for each column on a commonly connected memory line, one recognizes that the scanning technique also reduces the time needed to program an array with multiple columns (or rows).

Since the reading of both arrays is rudimentary for one skilled in the art, in view of the foregoing description and the plots shown in FIG. 2, elaborate development of the READ mode will be dispensed with. It suffices to note that READ lines $V_R$ are energized with +5 volts, commonly or by selective grouping of alternate columns, memory lines $V_M$ set at a 0 bias voltage, the bit line signals applied to lines $V_B$, and the bit line voltage sensed for the presence of a ground potential created when a conductive path is formed through the cell to line $V_S$. Note, however, that one or the other of the two read lines in the array of FIG. 6 must be selected for energizing with +5 volts, while the other remains at 0 volts, in conformance with the column being read. In the array appearing in FIG. 7, a single read line, $V_R'$, serves the whole array. One skilled in the art undoubtedly recognizes that though line $V_S$ is preferably grounded, and bit line $V_B$ supplied with voltage from a high impedance source, to read the cell state, it is the conductive path through the cell that comprises the essential operating feature of the cell. Thus line $V_S$ is equally suited to be an output line, given the proper selection of impedances and voltage sensing locations. As another alternative, it is equally feasible to provide +5 volts to line $V_S$ and sense the current flow to an electrical ground at line $V_B$.

Figure 8:
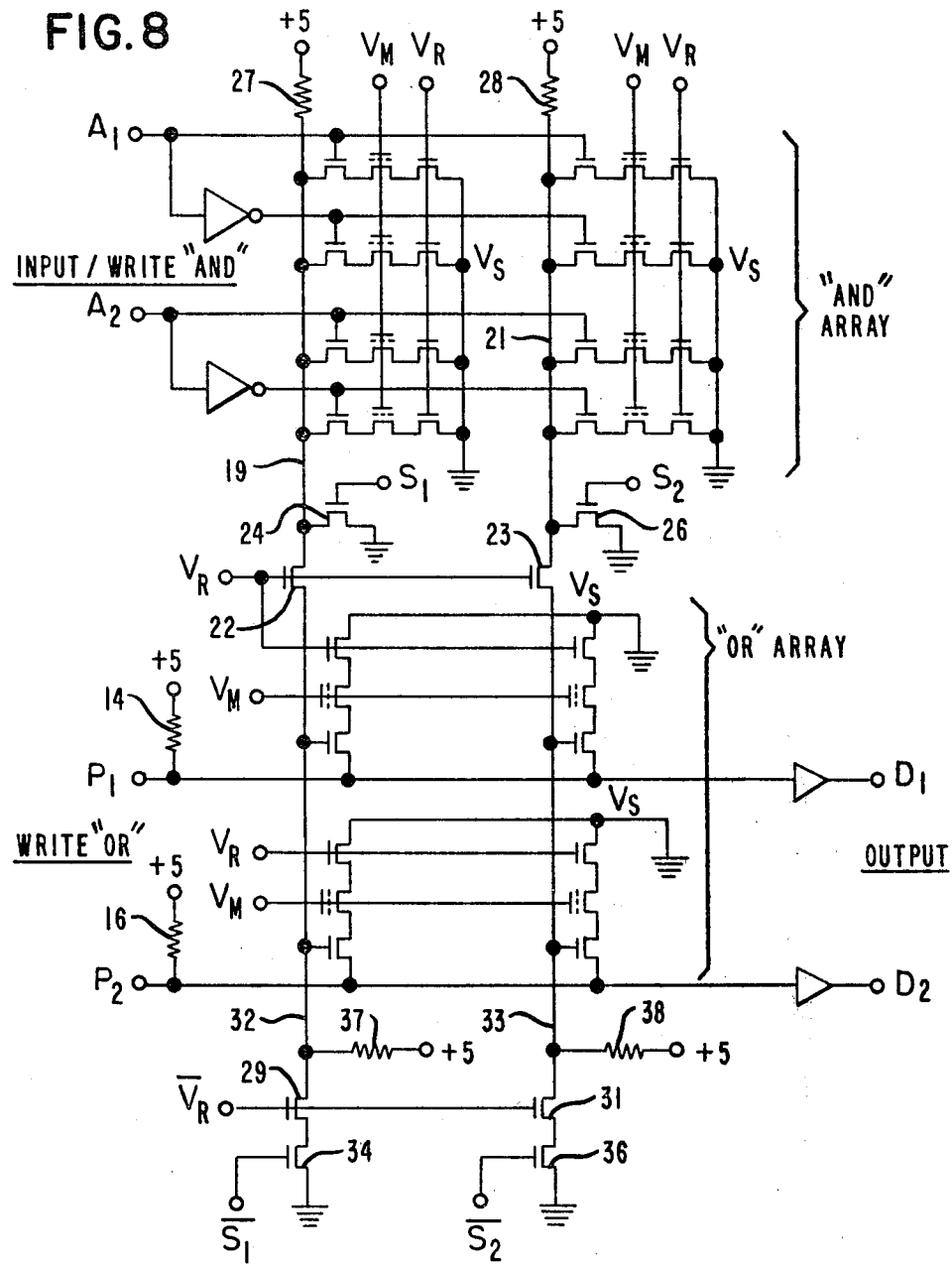
FIG. 8 contains a schematic of a PLA utilizing the present cells.

A more elaborate implementation of the three gate, three transistor memory cell appears in FIG. 8 of the drawings. The structural organization depicted there is generally known as a two input, two output PLA, here including the further refinement of nonvolatile state storage. A shift register circuit, used to generate a sequence of pulses used during the WRITE mode in the PLA, is shown in FIG. 9 of the drawings.

In an overview of the PLA circuit depicted in FIG. 8, note that the "AND" segment of the array is first to receive the input data. Consequently, the "AND" array output serves as the "OR" array input. Furthermore, output signals at $D_1$ and $D_2$ appear only when the states of input signals conform to the logic program in the PLA. To satisfy the diversity of logic programs normally sought, the AND segment of the array receives both the input signal and its inverse. Functionally, the PLA depicted in FIG. 8 is designed to generate output signals at $D_1$ and $D_2$ only when all cells in the program path are nonconducting. The program to be stored in the AND segment of the array is entered using lines $A_1$ and $A_2$, in a manner to be described with particularity hereinafter. Writing of the OR array utilizes lines $P_1$ and $P_2$.

With a general understanding of the PLA at hand, the ensuing inquiry will be directed to a characterization of the various logic signals within the PLA. Thereafter, the operation of the array will be considered as a whole. For purposes of the ensuing description, the embodying array is composed of n-channel cell elements with the logic "1" state represented by +5 volts and the logic "0" state appearing as 0 volts.

As shown in the PLA, line $V_S$ is at ground potential throughout the array, indicating that a conducting state in a cell during the READ mode will draw line $V_B$ of the corresponding cell to ground potential. The memory transistor line designated $V_M$ performs an ERASE function when energized with −20 volts, and a WRITE function when energized with a sequence of brief +20 volt pulses. For the AND array the bit lines $V_B$ are in column lines at reference numerals 19 and 21. In the OR array the bit lines are also in columns (by definition), and are continuums of programming input lines $P_1$ and $P_2$. The data states entered using lines $A_1$ and $A_2$, as well as their inverses, serve as the word lines of the AND array, while the word lines in the OR array are continuations of AND array bit lines 19 and 21. The AND array bit lines and OR array word lines are joined through decoupling transistors 22 and 23.

Programming of the array is best understood by considering the various potential combinations of signals on lines $V_R$, $S_1$ and $S_2$. Read line $V_R$ is provided with a +5 volt command signal only when the PLA enters the READ mode. During periods other than READ, the AND and OR arrays are essentially decoupled by transistors 22 and 23. During the WRITE mode a +5 volt signal is entered and sequentially clocked through the shift register circuit in FIG. 9 to produce pulses on lines $S_1$ and $S_2$. The pulses on lines $S_1$ and $S_2$ sequentially connect AND array lines 19 and 21 to ground potential. Absent signals on lines $S_1$ and $S_2$, transistors 24 and 26 are nonconducting and the +5 volts is supplied through resistors 27 and 28 to lines 19 and 21 of the AND array. Recalling that lines 19 and 21 correspond to cell bit lines, it becomes apparent that the AND array cells are amenable to programming by synchronizing the signals on lines $A_1$ and $A_2$, the shift register pulses on lines $S_1$ and $S_2$, and the WRITE mode pulse on line $V_M$. For instance, if $S_1$ is +5 volts, driving bit line 19 to 0 volts, as +5 volts is supplied to word line $A_1$ and a sequence of +20 volt WRITE mode pulses are applied to memory line $V_M$, the upper left cell in the AND array is written into the logic "1" state.

It should not be overlooked that the exact opposite binary state is simultaneously written into the cell of the same column and immediately succeeding row, since the inverse of $A_1$, $\overline{A_1}$, is applied to the word line of that cell. Thereby, synchronization of the signals on word lines A, memory line $V_M$, and the clocked shift register pulse sequence, permits programming of the AND array in rapid succession column by column.

Next we turn our attention to the programming of the OR array. According to the convention used here, $\overline{V_R}$ is at +5 volts when $V_R$ is at 0 volts. Thus, with no READ mode signal present, transistors 29 and 31 are in a conducting state. The voltages on word lines 32 and 33 are defined by the conductivity states of transistors 34 and 36. If both transistors are off, the respective lines are at +5 volts through resistors 37 and 38. When either transistor is conducting, the respective line is brought to ground potential.

Note that for the OR array the shift register signals, $S_1$ and $S_2$, have been inverted for actuating the OR segment of the array. Note further, that in the OR array the word lines, 32 and 33, rather than the bit lines are being modulated during the WRITE mode. Accordingly, the WRITE mode levels provided at lines $P_1$ and $P_2$ must recognize this distinction in view of the states defined in Table A.

As an example consider the upper left cell in the OR segment of the array. To write a logic "1" state into the cell requires the coincidence of +5 volts on word line 32, 0 volts on bit line $P_1$ and a +20 volt WRITE mode pulse on memory line $V_M$. An $S_1$ signal of +5 volts properly places transistor 34 into a nonconducting state, while the grounding of line $P_1$ generates the 0 voltage on the bit line. As was true in the AND segment of the PLA, synchronism between commands on bit lines P, WRITE mode pulses on $V_M$ and shift register states S, also permits rapid programming of the OR array by columns.

The use of the scanning method to program both the AND and OR segments of the PLA should not be overlooked.

Reading of data through the PLA is accomplished by energizing the READ mode line, $V_R$, with +5 volts, placing memory line $V_M$ at 0 volts and entering binary data through the A input lines. An amplified output appears at lines $D_1$ or $D_2$, depending on the logic programmed and the states entered. Functionally, this is analogous to the requirement that a signal path from an entry at address A not be grounded by any memory cell in its propgression to an output on line D.

In partial summary, the three transistor cell in the PLA configuration embodiment shown is operated so that the following sequences and conditions are prescribed.

ERASE Mode $V_M$ is pulsed at $-20$ volts for 100 milliseconds.
All other lines are unrestricted.

WRITE Mode (the first column)

$V_M$ is pulsed with a sequence of $+20$ volt signals for a period of 10 milliseconds.
$V_R$ is 0 volts.
$S_1$ is $+5$ volts.
$S_2$ is 0 volts.
$A_1$ and $A_2$ define the AND array program.
$P_1$ and $P_2$ define the OR array program.
$D_1$ and $D_2$ are open.

WRITE Mode (the second column)

$V_M$ is pulsed with a sequence of $+20$ volt signals for a period of 10 milliseconds.
$V_R$ is 0 volts.
$S_1$ is 0 volts.
$S_2$ is $+5$ volts.
$A_1$ and $A_2$ define the AND array program.
$P_1$ and $P_2$ define the OR array program.
$D_1$ and $D_2$ are open.

READ Mode $V_M$ is 0 volts.
$V_R$ is $+5$ volts.
$S_1$ is 0 volts.
$S_2$ is 0 volts.
$A_1$ and $A_2$ are addressed by inputs of 0 or $+5$ volts.
$D_1$ and $D_2$ are logic array outputs.
$P_1$ and $P_2$ open.

Though the shift register circuit depicted in FIG. 9 is comparatively conventional in structure and operation, it may be useful, nevertheless, to focus attention on the important aspects of its operation. During programming a $+5$ volt pulse is entered into first shift register, 39, and propagated down the register circuit at a rate of one stage per clock pulse. Though the number of shift registers required increases with the size of the PLA, only one bit is entered and shifted throughout.

Figure 10:
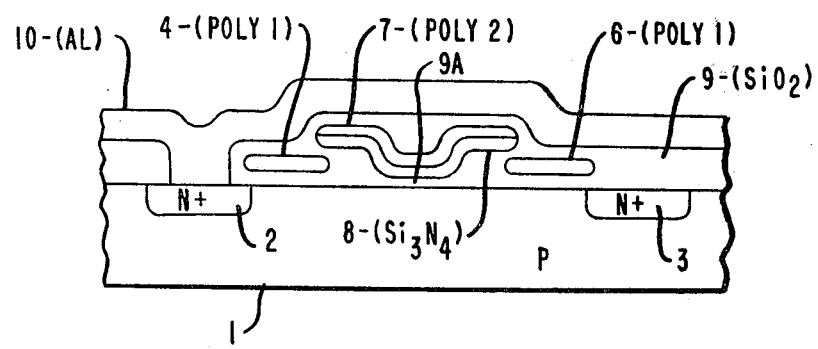
FIG. 10 contains a schematic cross-section of the unitary cell with structural illustrations.

Attention is now directed to FIG. 10 of the drawings, where the unitary structure of the three gate, three transistor cell is shown again. In FIG. 5 the inquiry was directed toward cell operation; here the focus of attention is on fabrication. Identity in the reference numerals has been retained.

To keep the ensuing description in perspective, it should be noted at the onset that the processing of FETs and MNOS transistors is a highly refined art. Given the three transistor cell described hereinbefore, paying particular attention to the process steps affecting the important parameters specifically noted, it is believed that one moderately skilled in the art should be able to fabricate one or more cells with relative ease. Nevertheless, to further supplement the known art, those aspects of the structure which are considered peculiar to an embodying cell will be highlighted.

As presently conceived, multiple cells of the unitary form shown in FIG. 10 are interconnected using n+ regions diffused or implanted in the substrate, aluminum alloy (Al—Si, Al—Si—Cu) conductors, two heavily doped polycrystalline silicon layers, hereafter called poly 1 and poly 2. The poly 1 layer includes gate electrodes 4 and 6 of the transistors, while the poly 2 layer comprises the doped polycrystalline silicon layer, 7, situated directly over and coextensive with silicon nitride layer 8.

The unitary cell is conceived to have an overall width of approximately 24 micrometers. Poly 1 gates 4 and 6, as well as the poly 2 gate region proximate substrate 1, are approximately 4 micrometers in width. The lateral overlap between the poly 1 and poly 2 layers is approximately 1.5 micrometers, a value primarily influenced by the 1 micrometer fabrication tolerance of available processing equipment.

In the vertical direction as shown, the cell is fabricated so that poly 1 and poly 2 are approximately 3,000 to 5,000 Angstroms in thickness, while silicon nitride layer 8 has a thickness of approximately 400 Angstroms. The silicon dioxide separating silicon nitride layer 8 from poly 1 layers 4 and 6 is approximately 900 Angstroms in thickness. Finally, the thickness of the silicon dioxide separating the poly 1 layers from substrate 1 is approximately 700 Angstroms, while the corresponding separation between MNOS transistor silicon nitride layer 8 and substrate 1, layer 9A, is approximately 15–30 Angstroms. Finally, the p-type substrate preferably has a $<100>$ crystal orientation and a resistivity of 15 to 20 ohm-centimeters.

Given the foregoing descriptions of structures and functions, one having the requisite skills in the art will recognize the need for multiple implants in the substrate to properly adjust the dopant concentrations for each of the three transistors. Furthermore, with the representative dimensions disclosed, the remaining steps for fabricating cells single or in arrays are believed to be well within the skills of those professing to be routinely practicing the art.

Though the invention has been shown and described by way of specific embodiments comprising two field effect type transistors and an MNOS type alterable threshold transistor, one undoubtedly recognizes that the underlying concepts presented herein are significantly more encompassing. For instance, it is contemplated that the memory element in the cell includes other structural configurations characterized by their being responsive to an electric field between a gate electrode and a conductive channel so as to alter the threshold of the memory element. Consequently, such broader practices of the invention are both contemplated and believed to be within the scope and spirit of the claims attached hereto.

We claim:

1. A three element programmable memory cell capable of being erased, programmed and read using a first address line, a second address line, a memory line, a read line and a third line, comprising:
   a first field effect transistor, having a gate electrode, electrically coupled to said first address line, a first conductive path electrode, electrically coupled to said second address line, and a first conductive path virtual node;
   a second field effect transistor, having a gate electrode, electrically coupled to said read line, a first conductive path electrode, electrically coupled to said third line, and a first conductive path virtual node;

memory means, having a gate electrode, electrically coupled to said memory line, first and second conductive path virtual nodes respectively coupled to said first conductive path virtual nodes of said first and second field effect transistors, and a threshold voltage level responsive to a voltage pulse on said memory line in time coincidence with the formation of a conductive path through said first field effect transistor between said second address line and said first conductive path virtual node, for forming a conductive path between said first and second conductive path virtual nodes of said memory means in response to the relative magnitude between a voltage on said memory line and an alterable threshold voltage in said memory means;

means for generating voltages, coupled to the lines of said memory means, said first field effect transistor and said second field effect transistor, characterized in its provision of voltage sequences, including;

a first sequence, suitable to program said cell to a first binary state, comprising, a coupling of voltages to said first address line and said memory line in substantial time synchronism with substantially zero voltages on said second address line and on said read line;

a second sequence, suitable to program said cell to an alternate, second binary state, comprising, a coupling of voltages to said memory line and to said first and second address electrodes, suitable to electrically decouple said second address line from said first conductive path virtual node of said first field effect transistor, in substantial time synchronism with a substantially zero voltage on said read line; and a third sequence, suitable to read the binary state programmed into said cell, comprising, a coupling of voltages to said first address line and to said read line in substantial time synchronism with a substantially zero voltage on said memory line; and means for sensing the conductivity between said second address line and said third line.

2. The cell recited in claim 1, wherein said cell is unitary in structure, having a substrate with first and second conductive regions, electrically common with said first conductive path electrodes in said first and second field effect transistors, respectively, joined by a current flow channel in said substrate, a first transistor gate electrode electrically insulated from said substrate and in proximity to said channel adjacent said first conductive region, a second transistor gate electrode electrically insulated from said substrate and in proximity to said channel adjacent said second conductive region, and a memory means gate electrode electrically insulated from said substrate and in proximity to said channel medial of said first and second transistor gate electrodes.

3. The cell recited in claim 2, wherein said three gate electrodes together form a structural continuum over said channel.

4. The cell recited in claim 3, wherein said memory means and said field effect transistor gate electrodes are symmetrically disposed with respect to said first and second conductive regions in said substrate, said memory means gate electrode is heavily doped polycrystalline silicon, and said memory means gate electrode is coextensive with and in immediate contact with a silicon nitride layer located between said memory means gate electrode and said channel.

5. The cell recited in claim 4, wherein said substrate channel dopant concentration in the proximity of said first and second transistor electrodes differs from said substrate channel dopant concentration in the proximity of said memory means electrode.

6. The cell recited in claim 5, wherein said memory means is a nonvolatile alterable threshold transistor, said field effect transistors are n-channel devices, and the signal on said memory line has a nominal magnitude of 20 volts and duration of 1 millisecond.

7. The cell recited in claim 1, wherein the voltages coupled to said gate and first conductive path electrodes of said first field effect transistor are substantially equal in mangitude.

8. The cell recited in claim 1 or 7, wherein the voltage coupled to said gate electrode of said memory means is substantially greater in relative magnitude than either of the voltages coupled to said gate and first conductive path electrodes of said first field effect transistor, and is comprised of a sequence of multiple pulses.

* * * * *